(12) United States Patent
Mailloux et al.

(10) Patent No.: US 12,199,652 B2
(45) Date of Patent: Jan. 14, 2025

(54) RADIOFREQUENCY DEVICE

(71) Applicant: THALES, Courbevoie (FR)

(72) Inventors: Pierre-Yves Mailloux, Cholet (FR);
Wilfried Demenitroux, Cholet (FR);
Nicolas Berthou, Cholet (FR)

(73) Assignee: THALES, Courbevoie (FR)

( * ) Notice: Subject to any disclaimer, the term of this patent is extended or adjusted under 35 U.S.C. 154(b) by 148 days.

(21) Appl. No.: 17/789,122

(22) PCT Filed: Dec. 21, 2020

(86) PCT No.: PCT/EP2020/087519
§ 371 (c)(1),
(2) Date: Jun. 24, 2022

(87) PCT Pub. No.: WO2021/130188
PCT Pub. Date: Jul. 1, 2021

(65) Prior Publication Data
US 2023/0051307 A1  Feb. 16, 2023

(30) Foreign Application Priority Data

Dec. 26, 2019  (FR) ...................................... 1915617

(51) Int. Cl.
*H04B 1/10*  (2006.01)
*H03H 9/46*  (2006.01)
(Continued)

(52) U.S. Cl.
CPC ............. *H04B 1/1036* (2013.01); *H03H 9/46* (2013.01); *H04B 1/0053* (2013.01); *H04B 1/40* (2013.01)

(58) Field of Classification Search
CPC ...... H03H 9/46; H04B 1/0053; H04B 1/0057; H04B 1/1036; H04B 1/109; H04B 1/40
See application file for complete search history.

(56) References Cited

U.S. PATENT DOCUMENTS

| 2006/0057959 | A1  | 3/2006 | Vacanti et al. |
| 2007/0091988 | A1* | 4/2007 | Sadri ................... H04B 1/0057 375/219 |

(Continued)

*Primary Examiner* — Nguyen T Vo
(74) *Attorney, Agent, or Firm* — Baker Hostetler

(57) ABSTRACT

A radiofrequency device includes at least the following elements: an antenna, linked to a first transmission channel or reception channel selection device $K_1$, followed by a front-end stage whose output is linked to a second transmission channel or reception channel selection device $K_2$, a group of filters connected between the second selection device $K_2$ and a third transmission channel or reception channel selection device $K_3$, the third selection device $K_3$ is connected to a transceiver, the transceiver comprises a converter part, wherein the group of filters comprises N filters having distinct frequency bands $B_N$ in a given bandwidth $B_T$, the group of filters is linked to a manager selecting at least one of the filters Fj of the group of filters in order to attenuate a first type of disturbing signals $P_1$, in the vicinity of the centre frequency of the channel to be received, the transceiver comprises a stage comprising a variable filter, the variable filter is configured in order to eliminate a second type of disturbing signals $P_2$, the stage is connected between the group of filters and the analog-digital and digital-analog conversion set, the number N of filters of the group of filters is chosen by taking into account the operating frequency band value of the antenna, the value of a selected bandwidth Bc and a coefficient $\delta$ taking into account overlap effects.

9 Claims, 4 Drawing Sheets

(51) Int. Cl.
  *H04B 1/00* (2006.01)
  *H04B 1/40* (2015.01)

(56) References Cited

U.S. PATENT DOCUMENTS

| | | |
|---|---|---|
| 2012/0289171 A1 | 11/2012 | Vogas |
| 2013/0052973 A1 | 2/2013 | Mo et al. |
| 2018/0367167 A1 | 12/2018 | Sorokopud et al. |
| 2019/0379329 A1* | 12/2019 | Kwok .................. H03F 1/0205 |
| 2020/0195282 A1* | 6/2020 | Lax .......................... H04B 1/26 |

* cited by examiner

RADIOFREQUENCY DEVICE

CROSS-REFERENCE TO RELATED APPLICATIONS

This application is a National Stage of International patent application PCT/EP2020/087519, filed on Dec. 21, 2020, which claims priority to foreign French patent application No. FR 1915617, filed on Dec. 26, 2019, the disclosures of which are incorporated by reference in their entirety.

FIELD OF THE INVENTION

The invention relates to a radiofrequency architecture. It lies within the field of radiofrequency RF electronics extending from a few kHz to a few GHz, in radiofrequency stations.

BACKGROUND

The radiofrequency stations are designed to operate in dense electromagnetic environments in which multiple radiocommunication stations need to be able to coexist. These days, to address this constraint, the radiofrequency modules incorporate filtering functions. To these functions are added frequency transposition stages in order to effectively filter the disturbing signals originating from stations situated nearby.

One of the objectives of a radio transceiver is:

On the one hand, to receive a wide dynamic range of radiofrequency signals in the presence of disturbing signals whose distance from the useful signal may range from a few tens of Hertz to several tens of MHz; an effective radio receiver is capable of receiving a useful signal of very low value in the presence of a disturbing signal of high value.

Also, a radio transmitter must be able to transmit a useful signal while limiting the transmission of spurious signals that are damaging to the other communication stations; an effective radio transmitter is capable of transmitting a signal with a spectral purity compatible with use of multiple colocated transceivers.

To address these needs, it is known practice to use a dual conversion superheterodyne RF architecture based on a narrow filtering generally using several surface acoustic wave or SAW filters. The RF signal that is wanted to be received or transmitted then passes into a fixed intermediate frequency stage in order to be able to filter the spurious signals with a narrow filter, as is illustrated in FIG. 1. The RF signal received on an antenna A is first of all filtered by a filter antenna 10 protecting the stages of the front part, or "front-end", such as the low noise amplifier or LNA or the mixer, from the nonlinearities due to the disturbing signals. It is then filtered by an intermediate frequency filter 11 filtering the interfering signals situated at from one to several tens of MHz from the useful signal, then by a low-frequency filtering 12 performing the filtering complement on the near disturbing signals, before passing into an analog-digital converter ADC. Likewise, in transmission, the signal is converted by a digital-analog converter DAC, followed by a low-frequency filtering stage 14 which is effective against the undesirable effects of the digital-analog conversion, then the signal is filtered through a high-frequency filter 15 allowing the filtering of the spurious signals close to the transmitted signal. It is followed by an antenna filter 16 which is effective against the non-linearities of the power amplifiers before transmission by the antenna A.

Such a structure has a bulk which does not always allow it to be installed when the environments are constrained and which exhibits a high component consumption.

Another solution is described in the patent application US2018367167, FIG. 2. The multiple-channel digital radio device proposed comprises an antenna 20, a wideband converter, a group of filters 21 connected between the antenna and the wideband converter 22, which is itself connected to a processing unit 23. The group of filters comprises several narrow-band surface acoustic wave filters having distinct and repetitive frequency bands within a given bandwidth. Each frequency band comprises several distinct channels. This architecture, despite its advantages, offers low protection against the disturbing signals.

The patent application US 2012/0289171 discloses a structure that allows the upper frequency limit of the radios or of the communication transceivers to be extended.

The patent application US 2013/0052973 describes a structure comprising a group of filters whose characteristics are determined according to a desired frequency value.

Hereinafter in the description, the expression "disturbing signals" designates signals which affect the operation of devices.

SUMMARY OF THE INVENTION

The invention relies on a novel architecture which uses a block of an RF transceiver combined with a bank of filters. This bank of filters is then located between the antenna and the RF transceiver, also referred to as "transceiver". The function of the bank of filters is notably to eliminate the disturbing signals in reception and in transmission without using an intermediate frequency stage.

The invention relates to a radiofrequency device comprising at least the following elements:

an antenna linked to a first transmission channel or reception channel selection device $K_1$, followed by a front-end stage whose output is linked to a second transmission channel or reception channel selection device $K_2$, a group of filters connected between the second selection device $K_2$ and a third transmission channel or reception channel selection device $K_3$, the third selection device $K_3$ is connected to a transceiver, the transceiver comprising a converter part (ADC, DAC), characterized in that:

the group of filters comprises N filters having distinct frequency bands $B_N$ in a given bandwidth $B_T$, the group of filters is linked to a manager selecting at least one of the filters Fj of the group of filters, in order to attenuate a first type of disturbing signals $P_1$, in the vicinity of the centre frequency of the channel to be received, the transceiver comprises a stage comprising a variable filter, the variable filter is configured to eliminate a second type of disturbing signals $P_2$, said stage is connected between the group of filters and the analog-digital and digital-analog conversion set, the number N of filters of the group of filters is chosen by taking into account the operating frequency band value Bt of the antenna, the value of a selected channel width Bc and a coefficient δ taking into account overlap effects.

The filters of the group of filters are, for example, filters configured to perform a narrow filtering function in a reduced bulk.

The filters of the group of filters can be chosen from the following list: surface acoustic wave SAW filter, bulk acoustic wave BAW filter.

The filters of the group of filters are, for example, chosen in order to process signals lying within the very high frequency VHF band.

The filters of the group of filters can be chosen in order to process signals lying within the ultrahigh frequency UHF band.

The antenna comprises, for example, a transmission channel and a reception channel.

The device comprises, for example, an antenna filter configured to filter a signal $S_r$, an amplifier adapted for amplifying the filtered signal $S_1$ before transmission to the group of filters, of which one of the filters is selected and activated in order to filter by at least 30 dB the spurious signals in transmission situated at more than 10 MHz from the frequency of the filter, a first amplifier adapted for amplifying the second filtered signal $S_2$, an IQ demodulator of the second signal $S_2$, a phase splitter and a phase locked loop generating a signal mixed with the second filtered signal before a third filter with variable frequency whose centre frequency $F_3$ is chosen in order to eliminate the disturbing signals of the order of from 1 MHz to 10 MHz from the reception channel.

The device can comprise a transmission channel comprising two ADC converters each linked to a first filter, with variable frequency configured to filter the replicas linked to the converters, two amplifiers, one amplifier being connected to an output of a first filter, a phase splitter and a phase locked loop delivering a mix signal with the two signals from the amplifiers, a filter of the group of filters selected and activated by the manager, in order to filter spurious signals from +/−8 MHz to +/− several hundreds of MHz before transmission to the transmission part of the antenna.

The variable filtering and IQ modulation/demodulation stage and the converters are for example disposed on one and the same component.

BRIEF DESCRIPTION OF THE DRAWINGS

Other features and advantages of the present invention will become more apparent on reading the description of an exemplary embodiment given in an illustrative and nonlimiting manner, with attached figures which represent.

DETAILED DESCRIPTION

The example detailed hereinbelow is given by way of illustration in order to give a good understanding of the architecture according to the invention. The architecture according to the invention is not limited to the example detailed hereinbelow. The invention is applicable to other embodiments which can be put into practice or produced in different ways.

Figure 1:
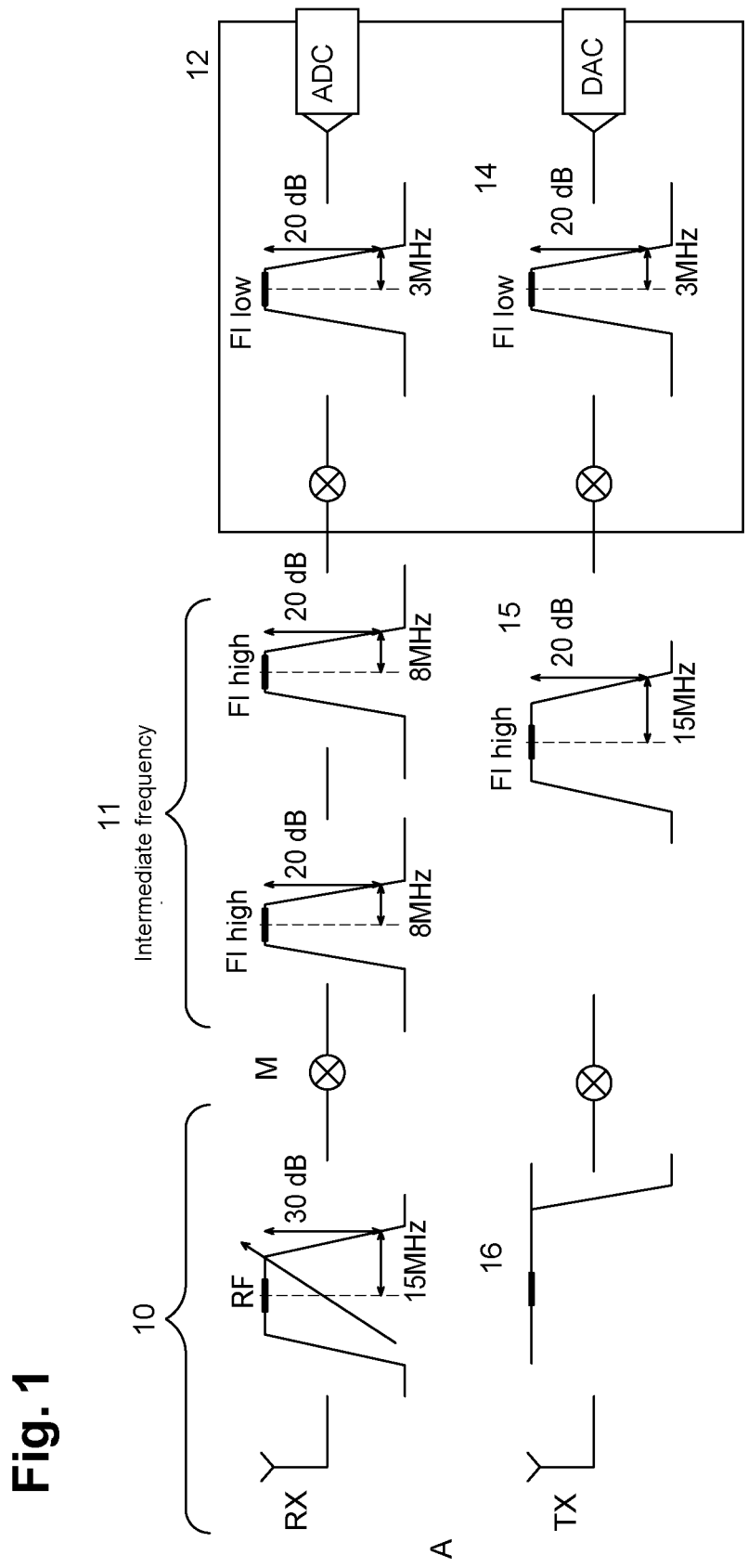
FIG. 1, a filtering plan for an RF band transceiver according to the prior art.
Figure 2:
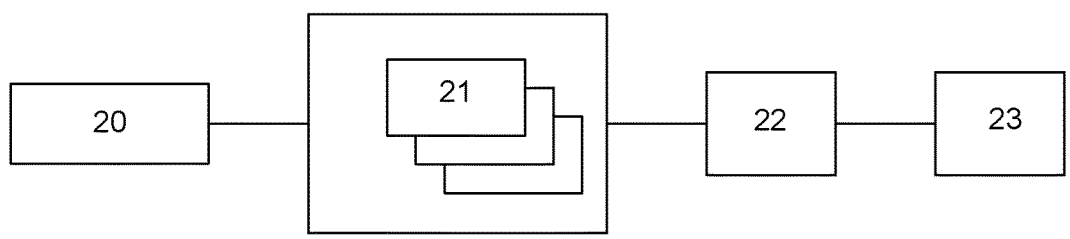
FIG. 2, an architecture known from the prior art.
Figure 3:
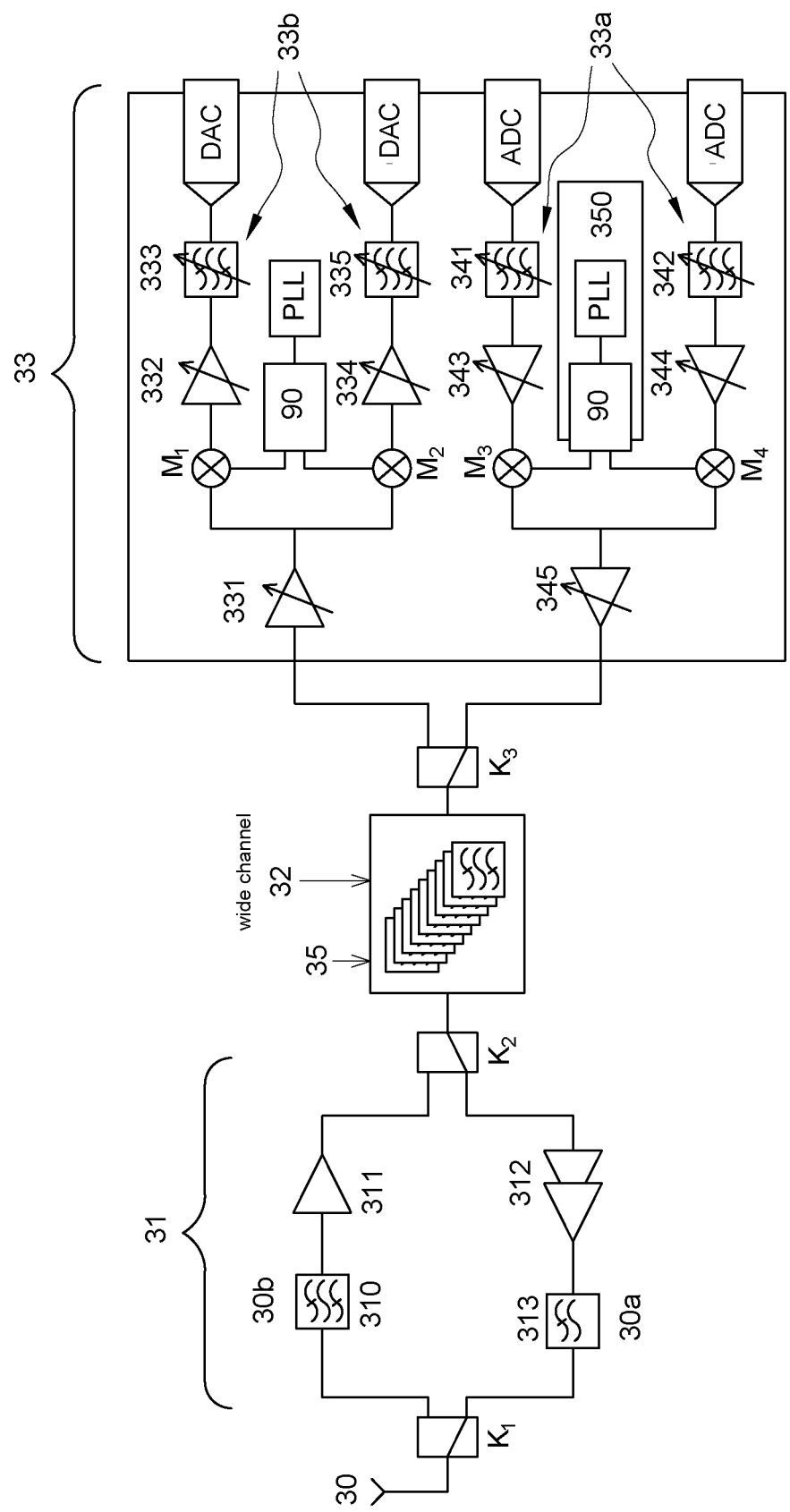
FIG. 3, an example of a block diagram of the architecture according to the invention, and FIG. 4, an example of a filtering plan for a UHF band receiver.

FIG. 3 illustrates a block diagram of an example of an architecture according to the invention for a single-channel use. The system according to the invention comprises a reception and/or transmission antenna 30 linked to a first transmission channel or reception channel selection device $K_1$, followed by a front-end stage 31 whose output is linked to a second transmission channel or reception channel selection device $K_2$, which is itself linked to a set or group of several filters 32, connected to a transmission channel or reception channel selection device $K_3$. The third selection device $K_3$ is connected to an RF transceiver, or simply "transceiver", 33, comprising a channel for processing the reception signals and a channel for processing the transmission signals.

The antenna 30 comprises a transmission channel 30b and a reception channel 30a. It is configured to receive and transmit a radiofrequency RF radiation in a frequency band specified by the application, which at least partly overlaps the frequency bands of the group of filters and the bandwidths of the ADC and DAC converters.

Considering the reception channel, a signal Sr is received on the antenna 30. The signal is first of all filtered by an antenna filter 310 to a first frequency $F_1$, the filtered signal $S_1$ is then amplified by an amplifier 311, before transmission to the group of filters 32. The group of filters comprises N filters $320_1 \ldots 320_N$. Like the filters used in the intermediate frequency stages on the superheterodyne architectures, each filter performs the disturbing signal filtering function, attenuating by at least 30 dB the signals which would be located at approximately ten or so MHz to several hundreds of MHz from the useful signal. The centre frequency Fc of each of the filters, and their bandwidth B, allows all the frequency band that is wanted to be received on the antenna to be covered. An overlap in the bandwidth of the filters is necessary in order to receive or transmit in all the channels. The intermediate frequency stage then becomes unnecessary, the bank of filters performing this function for all the frequencies that are wanted to be transmitted or received. The group of filters receives a command from a manager 35 which selects a filter to be used as a function of the channel that it is wanted to be received or transmitted. With the filter being selected and activated at a centre frequency $F_2$, all the disturbing signals in the reception or all the spurious signals in transmission which will be located more than a given frequency value a, for example 10 MHz, from the frequency of the filter will then be filtered by at least β, for example 30 dB. The filtered signal $S_2$ is transmitted to the transceiver 33. The filtered signal $S_2$ is amplified in a first amplifier 331. After this amplifier, the signal $S_2$ passes through an IQ demodulator. It is then mixed, $M_1$, $M_2$, with a signal $S_{90}$ from a phase splitter and a phase locked loop 350, before being transmitted to a second amplifier 332, 334, then filtered by a third variable frequency filter 333, 335, whose centre frequency $F_3$ will be chosen so as to eliminate the disturbing signals very close (of the order of from 1 MHz to 10 MHz) to the channel that is wanted to be received. The filtered signal $S_3$ is then transmitted to a digital-analog converter, DAC.

The antenna filter 310 is chosen to operate in a frequency band $[F_{Min}, F_{Max}]$ determined by the application.

The number N of filters that make up the group of filters is determined, for example, by taking into account the total receiver band Br divided by the channel width Bc and by multiplying by a coefficient δ, for example equal to two in order to take account of the overlap effects, a phenomenon known to the person skilled in the art which will not be explained.

The group of wide channel filters (bank of SAW filters) allows protection from the near and far interfering signals (~10 MHz to 100 MHz): these are the strongest disturbing signals which require a filtering before passing into the RF transceiver.

The narrow band filtering is performed by the variable filter of the RF transceiver: the latter contains a tunable analog filtering allowing a narrow filter to be produced for the very near disturbance signals (~2 MHz to 10 MHz).

To illustrate the architecture according to the invention, a numbered example will be given for operation in reception.

Considering a total band Bt at the receiver of [225 MHz-400 MHz]. The characteristics of the first antenna filter (centre frequency, for example) are determined so as to eliminate the disturbing signals present outside of the [225 MHz-400 MHz] band. Considering also that the signal to be received is located at a frequency Fs of 260 MHz with a bandwidth of 2.5 MHz, the second filter $F_2$ selected in the group of filters is configured with a centre frequency $F_{c2}$ adapted for allowing the 260 MHz+/−1.25 MHz channel while offering an attenuation of 30 dB at +/−8 MHZ from 260 MHz in order to eliminate the disturbing signals located between +/−8 MHz and plus or minus several hundreds of MHz. The third variable filter $F_3$ is configured in order to eliminate the disturbing signals between +/−2 MHz and +/−8 MHz, for example with a narrow channel filter, a centre frequency $F_{c3}$ fixed at 3 MHz and a 30 dB attenuation in the 1 MHz channel band.

The filters of the group of filters are for example "SAW" filters, or "BAW" (bulk acoustic wave) filters, or any other technology allowing a narrow filtering function to be produced in a reduced bulk.

When the architecture operates in transmission, the configurations of the filters are chosen in a way similar to that described for the reception mode operation of the architecture.

The signal to be transmitted $S_e$ by the antenna 30, via its transmission channel 30a, is transmitted in parallel via two ADC converters (analog-digital converters) to two first filters 341, 342, with variable frequencies situated in parallel allowing, among other things, the replicas linked to the use of the ADC to be filtered. The signal is then amplified via two amplifiers 343, 344, one amplifier being connected to an output of a first filter. At the output of the amplifiers, the IQ signals are mixed $M_3$, $M_4$, with a signal $S_{90}$ from a phase splitter and a phase locked loop 350, in an IQ modulator before being transmitted into one and the same amplifier 345. The recombined and amplified signal is transmitted to the group of filters 32 of which one of the filters is selected and activated by the manager 35. The signal filtered of the spurious signals from +/−8 MHz to plus or minus several hundreds of MHz is then transmitted to the transmission chain of the antenna, via the switches $K_1$, $K_2$, set for transmission, then amplified via a first amplifier 312, then filtered by a harmonic filter 313 before being transmitted by the transmission part 30a of the antenna 30.

Figure 4:
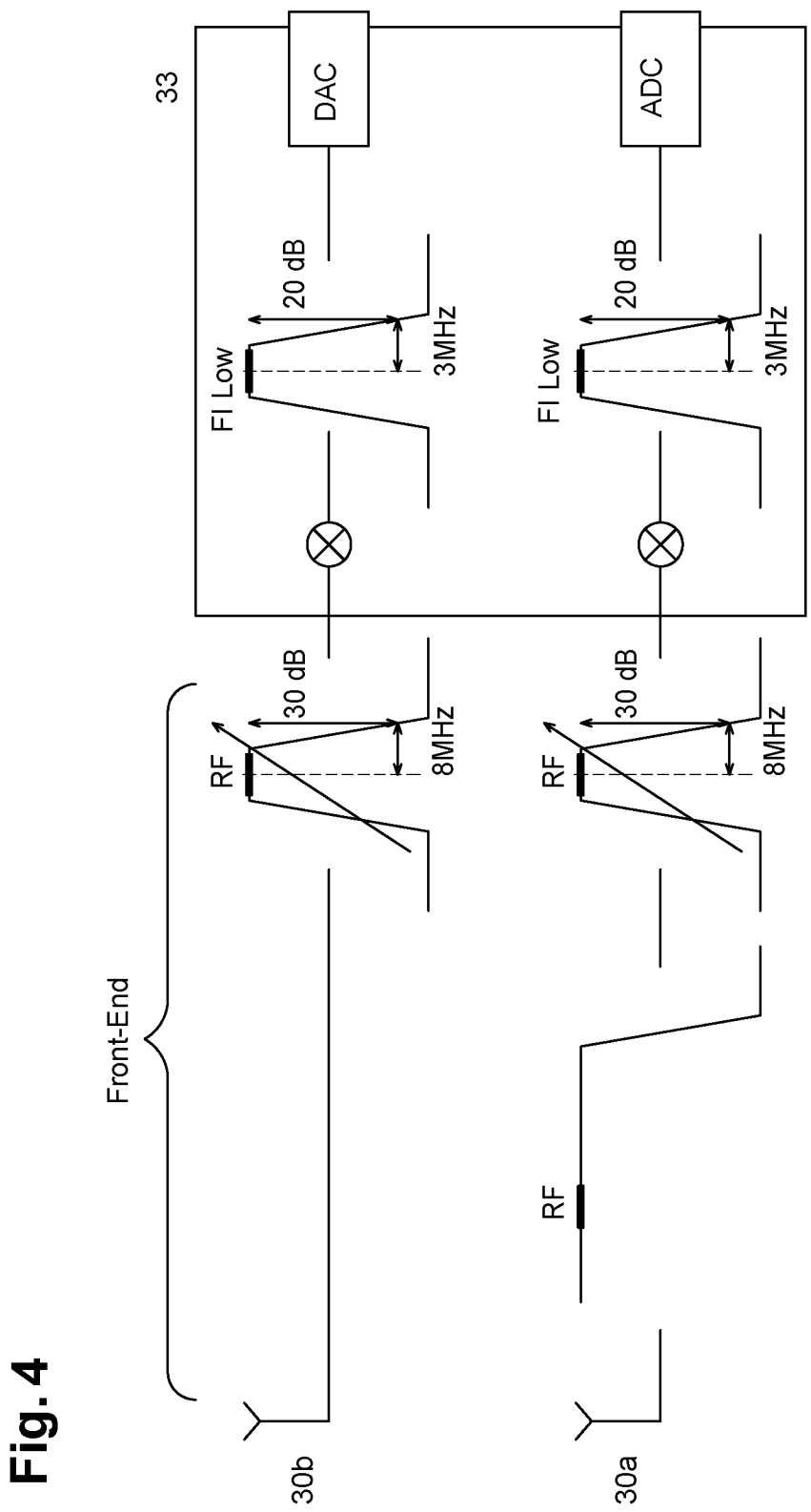

FIG. 4 illustrates, in its top part, an example of a filtering plan for a UHF band receiver and, in its lower part, for a UHF band transmitter.

The signal received on the antenna after passing through the antenna filter is filtered at +/−8 MHz in a filter $F_j$ selected from the group of filters 32 in order to eliminate a first type of disturbing signals $P_1$, then filtered in the variable filter whose centre frequency is set at 3 MHz to eliminate a second type of disturbing signals $P_2$, closer to the centre frequency to be received, before being transmitted to the digital-analog converter DAC.

The architecture of the radiofrequency device according to the invention can be used in the field of communications for the UHF and VHF bands, band S, etc.

The transceiver (transmitter-receiver) part can be produced on one and the same component of small size.

The architecture according to the invention uses a bank of wide channel filters and an RF "transceiver". The architecture no longer requires the use of PLL, of intermediate frequency stages, of "front end" filtering for the reciprocal mixings/recombinations at the mixer. That results in a very significant gain in terms of consumption/bulk. The architecture then becomes simpler and the implementation (and therefore the development cost) is then easier.

The invention claimed is:

1. A radiofrequency device comprising at least the following elements:
    an antenna, linked to a first transmission channel or reception channel selection device $K_1$, followed by a front-end stage whose output is linked to a second transmission or reception channel selection device $K_2$,
    a group of filters connected between the second selection device $K_2$ and a third transmission channel or reception channel selection device $K_3$,
    the third selection device $K_3$ is connected to a transceiver,
    the transceiver comprising an analog-digital and digital-analog converter part wherein:
    the group of filters comprises N filters having distinct frequency bands $B_N$ in a given bandwidth $B_T$, the group of filters is linked to a manager adapted for selecting at least one of the filters Fj of the group of filters in order to attenuate a first type of disturbing signals $P_1$, in the vicinity of the centre frequency of the channel to be received,
    the transceiver comprises a stage comprising a variable filter, the variable filter is configured to eliminate a second type of disturbing signals $P_2$, said stage is connected between the group of filters and the analog-digital and digital-analog converter part,
    the number N of filters of the group of filters is chosen by taking into account the operating frequency band value Bt of the antenna, the value of a selected channel width $B_C$ and a coefficient δ taking into account overlap effects.

2. The device according to claim 1, wherein the filters of the group of filters are filters configured to perform a narrow filtering function in a reduced bulk.

3. The device according to claim 2, wherein the filters of the group of filters are chosen from the following list: surface acoustic wave SAW filters or bulk acoustic wave BAW filters.

4. The device according to claim 1, wherein the filter characteristics of the group of filters are chosen in order to process signals lying within a very high frequency VHF band.

5. The device according to claim 1, wherein the characteristics of the filters of the group of filters are chosen in order to process signals lying within an ultrahigh frequency UHF band.

6. The device according to claim 1, wherein the antenna is an antenna comprising a transmission channel and a reception channel.

7. The device according to claim 1, comprising an antenna filter configured to filter a signal $S_r$, to form a filtered signal $S_1$, an amplifier adapted for amplifying the filtered signal $S_1$ before transmission to the group of filters, of which one of the filters is selected and activated in order to filter by at least 30 dB the spurious signals in transmission situated at more than 10 MHz from the frequency of the filter to form a second filtered signal $S_2$, a first amplifier adapted for amplifying the second filtered signal $S_2$, an inphase/quadrature (IQ) demodulator of the second signal $S_2$, a phase splitter and a phase locked loop generating a signal mixed with the second filtered signal before a third variable frequency filter, of which a centre frequency $F_3$ is chosen in order to eliminate the disturbing signals of the order of 1 MHz to 10 MHz from the reception channel.

8. The device according to claim 1, comprising a transmission channel comprising two analog-digital converters ADC each linked to a first filter, with variable frequency configured to filter the replicas linked to the converters, two amplifiers, one amplifier being connected to an output of a first filter, a phase splitter and a phase locked loop delivering a mixed signal with the two signals from the amplifiers, a filter of the group of filters selected and activated by the manager in order to filter spurious signals from +/−8 MHz to plus or minus several hundreds of MHz before transmission to the transmission part of the antenna.

9. The device according to claim 1, wherein the transceiver is implemented on one and the same component.

* * * * *